US009577392B2

(12) United States Patent
Chang

(10) Patent No.: US 9,577,392 B2
(45) Date of Patent: Feb. 21, 2017

(54) USB TYPE-C CONNECTOR MODULE

(71) Applicants: Yi-Fang Chuang, New Taipei (TW); NICECONN TECHNOLOGY CO., LTD., New Taipei (TW)

(72) Inventor: Nai-Chien Chang, New Taipei (TW)

(73) Assignees: Yi-Fang Chuang, New Taipei (TW); NICECONN TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/085,014

(22) Filed: Mar. 30, 2016

(65) Prior Publication Data

US 2016/0336698 A1 Nov. 17, 2016

(30) Foreign Application Priority Data

May 13, 2015 (TW) .............................. 104115188 A

(51) Int. Cl.
```
H01R 24/60      (2011.01)
H01R 13/6598    (2011.01)
H01R 13/03      (2006.01)
H05K 1/18       (2006.01)
G06F 13/42      (2006.01)
G06F 1/26       (2006.01)
G06F 13/40      (2006.01)
H01R 107/00     (2006.01)
```
(52) U.S. Cl.
CPC ................. *H01R 24/60* (2013.01); *G06F 1/26* (2013.01); *G06F 13/4068* (2013.01); *G06F 13/4282* (2013.01); *H01R 13/03* (2013.01); *H01R 13/6598* (2013.01); *H05K 1/18* (2013.01); *H01R 2107/00* (2013.01)

(58) Field of Classification Search
CPC .............. H01R 13/665; H01R 13/6658; H01R 13/6675; H01R 13/6691; H01R 13/03; H01R 13/6598; H01R 24/00; G06F 1/26; G06F 13/4068; G06F 13/4282
See application file for complete search history.

(56) References Cited

U.S. PATENT DOCUMENTS 6,778,401 B1 * 8/2004 Yu ..................... G06K 19/07732
361/736
6,854,984 B1 * 2/2005 Lee .................. G06K 19/07732
439/607.41

(Continued)

*Primary Examiner* — Abdullah Riyami
*Assistant Examiner* — Harshad Patel
(74) *Attorney, Agent, or Firm* — Chun-Ming Shih; HDLS IPR Services

(57) ABSTRACT

A USB Type-C connector module includes a circuit board, a configuration-channel (CC) chip and a plurality of conductive terminals electrically connected with the circuit board. One end of the circuit board has a tongue, which a plurality of golden-fingers are arranged at two sides thereon. A USB Type-C connector is constituted by the tongue and the golden-fingers. CC golden-fingers of the USB Type-C connector are electrically connected to the CC chip for accepting a CC operation. Power golden-fingers of the USB Type-C connector are electrically connected to a power control chip of an external mainboard through the plurality of conductive terminals for receiving power. Data golden-fingers of the USB Type-C connector are electrically connected to a PCH of the external mainboard for transmitting data.

12 Claims, 8 Drawing Sheets

(56) References Cited

U.S. PATENT DOCUMENTS

| | | | | |
|---|---|---|---|---|
| 7,359,208 B2* | 4/2008 | Ni | ............................ | G11B 33/12 |
| | | | | 174/50.51 |
| 7,407,390 B1* | 8/2008 | Ni | ..................... | G06K 19/07732 |
| | | | | 361/752 |
| 7,824,227 B1* | 11/2010 | Lee | ..................... | H01R 13/6658 |
| | | | | 439/660 |

* cited by examiner

USB TYPE-C CONNECTOR MODULE

BACKGROUND OF THE INVENTION

Field of the Invention

The present invention generally relates to a connector and, in particular to a connector module.

Description of Prior Art

With the development of semiconductor industry, all kinds of electronic devices such as personal computers, tablet computers and smart phones are innovative. Because of convenience and powerful functionality, they spread to the general public living around rapidly.

In recent years, with the popularity of universal serial bus (USB), all kinds of electronic devices are almost provided with a USB port. Therefore, users can transfer data via USB interface easily. Currently the most common USB interfaces are USB2.0 for supporting 480 Mbps high-speed transmission rate, USB3.0 for supporting 5 Gbps high-speed transmission rate, and Micro USB providing for mobile electronic devices (i.e. smart phones).

However, with the rapid development of electronic devices, the transmission rate of above-mentioned USB2.0, USB3.0 and Micro USB have not been able to meet some users' needs. Thus a new generation of USB3.1 specification on the market is developed, wherein the USB 3.1 Type-C for supporting 10 Gbps transmission rate is the most attracted by users.

As USB Type-C has complex functions and with up to 24 terminals, one or more chips have to be disposed on a mainboard if a USB Type-C connector is provided in an electronic device. For example, a chip for detecting output signals through a configuration channel (CC) of a USB Type-C connector, a chip for switching an upper layer signals and a lower layer signals of USB Type-C, and a chip for amplifying input and output signals.

Hence the above chips will occupy the limited configuration space on the mainboard that will make the mainboard not have inadequate space for using. Therefore, nowadays electronic devices are minimized as a mainstream. Thus how to support USB Type-C interface without wasting configuration space and having difficulty in circuit design when those chips are disposed on the mainboard is the object of researchers of the present field.

SUMMARY OF THE INVENTION

Accordingly, an object of the present invention is to provide a USB Type-C connector module, wherein the USB Type-C connector and chips with configuration channel functions can be disposed in a single connector module through the circuit board for configuring an external mainboard and simplifying a circuit design.

In order to achieve the object mentioned above, the present invention provides a USB Type-C connector module including a circuit board, a CC chip and a plurality of conductive terminals electrically connected with the circuit board. One end of the circuit board has a tongue, which a plurality of golden-fingers are arranged at two sides thereon. A USB Type-C connector is constituted by the tongue and the golden-fingers. Two configuration channel (CC) golden-fingers of the USB Type-C connector are electrically connected with the CC chip for accepting a CC operation. A plurality of power golden-fingers of the USB Type-C connector are electrically connected with a power control chip of an external mainboard through the conductive terminals for receiving power. A plurality of data golden-fingers of the USB Type-C connector are electrically connected to a Plateform Controller Hub (PCH) of the external mainboard through the conductive terminals for transmitting data.

Comparing with the prior art, an effect of the present invention is that chips related to a USB Type-C interface, such as configuration channel chip, and the USB type-C connector are disposed in a single connector module together. As a result, when manufacturers need to add a USB Type-C interface on the external mainboard, the connector module of the present invention can be disposed directly on the mainboard. Thus the USB Type-C connector and its related chips can be quickly disposed on the external mainboard at the same time.

Moreover, the present invention disposes the chips related to a USB Type-C interface in the connector module so that the external mainboard does not have to dispose corresponding chips additionally. Therefore, a circuit design of the external mainboard could be simplified efficiently for reducing difficulties in circuit design of the external mainboard, and manufacturing costs will be greatly reduced.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
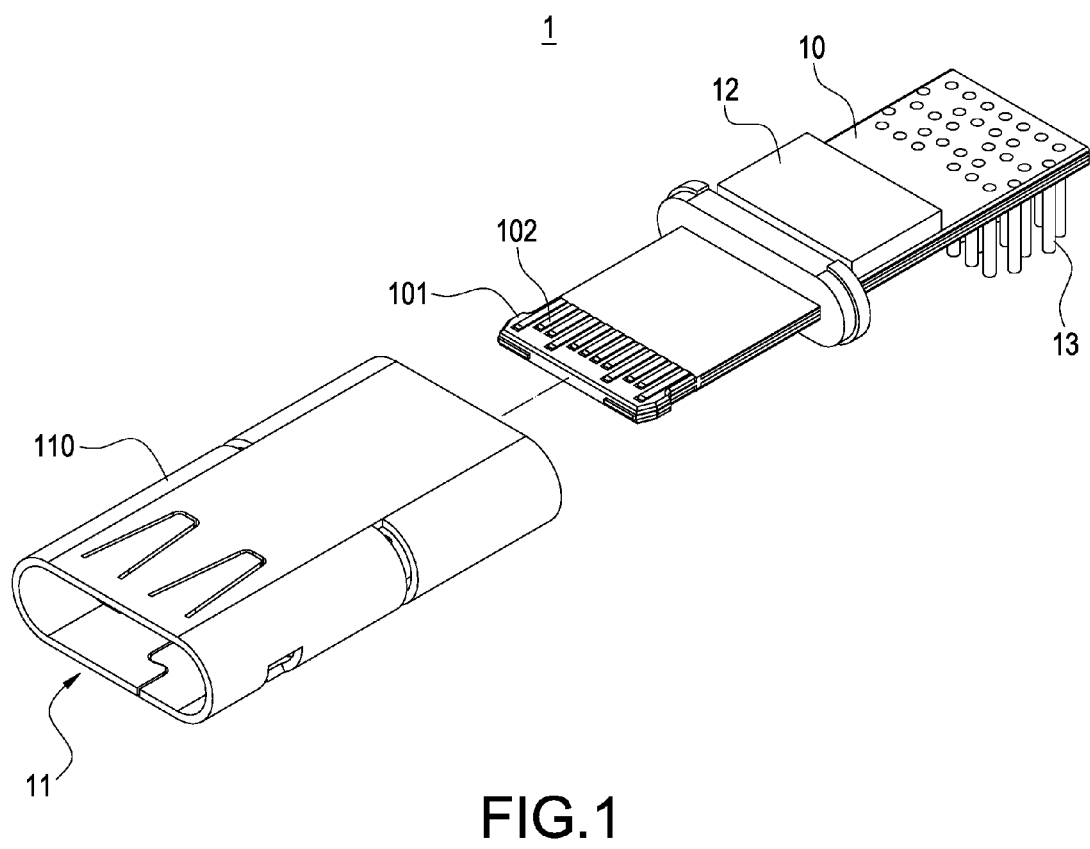
FIG. 1 is a perspective exploded view of a connector module according to a first embodiment of the present invention.
Figure 2:
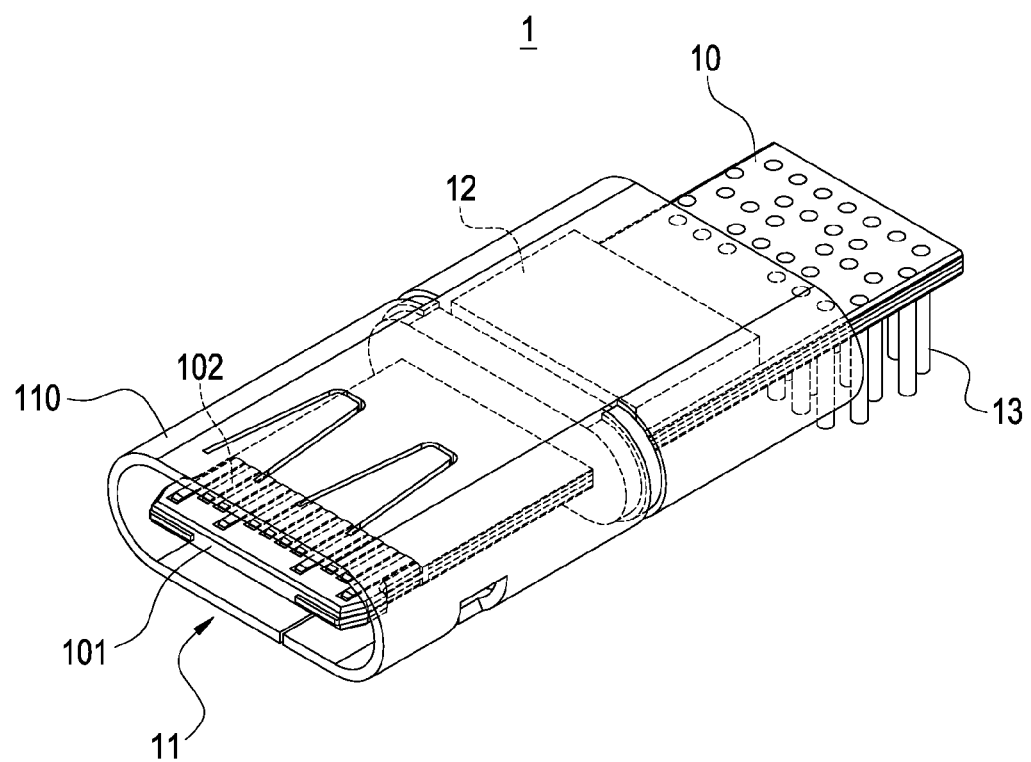
FIG. 2 is a perspective assembly view of a connector module according to a first embodiment of the present invention.

Please refer to FIG. 1 and FIG. 2, which depict a perspective exploded view and a perspective assembly view of a first embodiment of a connector module of the present invention. The present invention discloses a USB Type-C connector module (hereinafter briefly named the connector module 1) including a USB Type-C connector 11 and at least one chip related to a USB Type-C interface. More detailed are described as below.

As shown in FIG. 1 and FIG. 2, in a first embodiment of the present invention, the connector module 1 mainly includes a circuit board 10, a configuration channel (CC) chip 12 and a plurality of conductive terminals 13. One end of the circuit board 10 has a tongue 101, which a plurality of golden-fingers 102 are arranged at an upper and a lower sides thereon. Specifically, there are twelve golden-fingers arranged at an upper side of the tongue 101, and also twelve golden-fingers are arranged at a lower side of the tongue 101. A USB Type-C interface is constituted by the twenty-four golden-fingers and the tongue 101 together. In the present invention, the connector module 1 also has an iron shell 110 covering the tongue 101 and the golden-fingers 102. Thus the tongue 101, the golden-fingers 102 and the iron shell 110 are all together for constituting the USB Type-C connector 1.

Preferably, the iron shell 110 can directly cover the circuit board 10, the CC chip 12, and a plural of conductive terminals 13 that is provided, but not limited to, as an outer shell of the connector module 1.

The configuration channel chip 12 and the conductive terminals 13 are electrically connected with the circuit board 10.

With referring to FIG. 1, the USB Type-C connector 11 is provided in an end of the circuit board 10. In the present embodiment, the USB Type-C connector 11 is mainly a female USB Type-C connector, and the connector module 1 can connect with an external male USB Type-C connector through the USB Type-C connector 11. Thus a transmission of data and power will be performed through, but not limited to, the USB Type-C interface.

Figure 3:
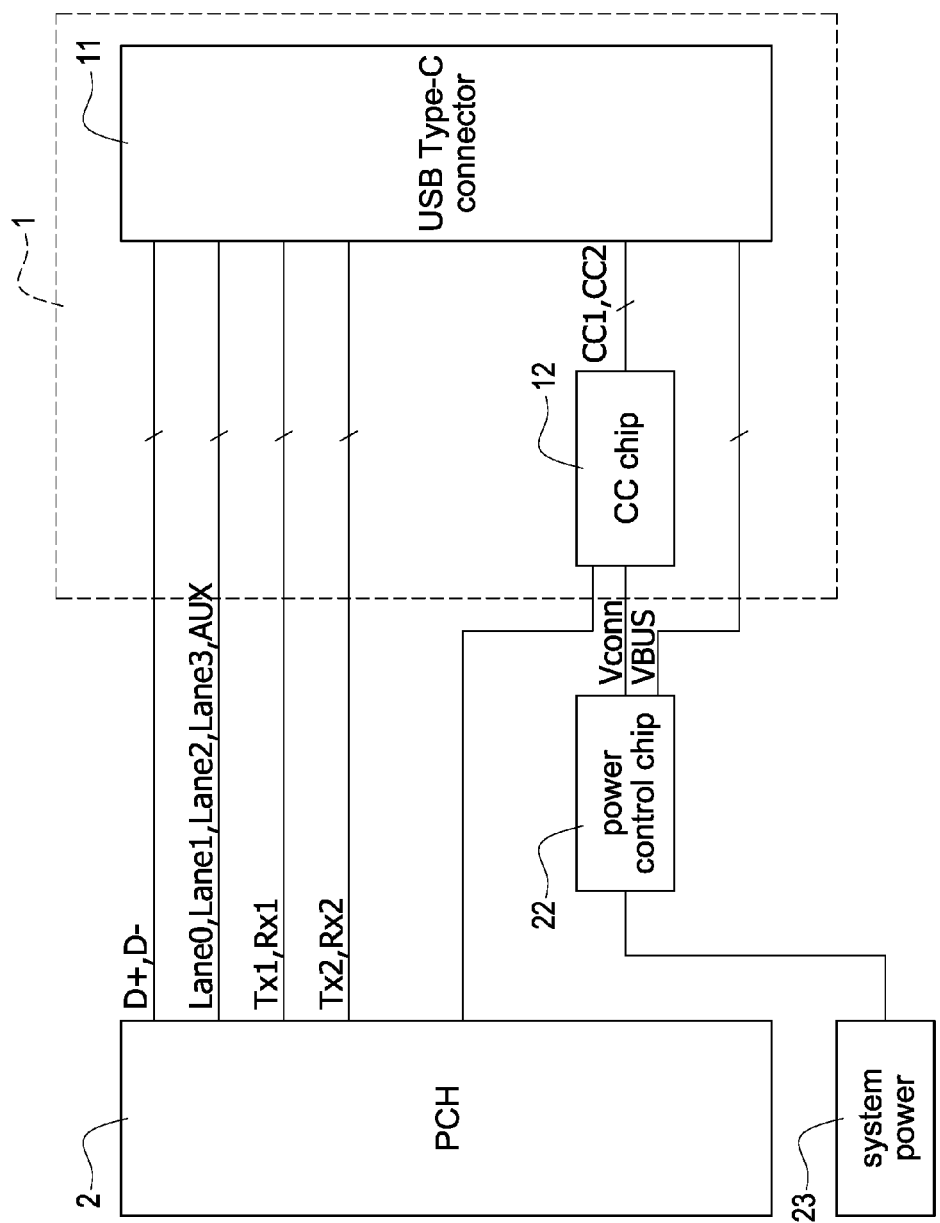
FIG. 3 is a circuit connection diagram according to a first embodiment of the present invention.

The CC chip 12 is electrically connected with the USB Type-C connector 11 through the circuit board 10; more specifically, the CC chip 12 is electrically connected with at least one of the golden-fingers 102 (i.e. the CC1 and CC2 golden-fingers showed in FIG. 3). Therefore, a configuration channel (CC) operation (as described later) of the USB interface is provided for the connector module 1.

The conductive terminals 13 are electrically connected on the circuit board 10 at another end away from the USB Type-C connector 11 and electrically connected with the USB Type-C connector 11 and the CC chip 12 through the circuit board 10. More specifically, one end of each conductive terminal 13 is electrically connected to the circuit board 10 and the other end is extended downwardly and protruded out of the iron shell 110. In the present embodiment, the connector module 1 is electrically connected to a mainboard of an electronic device through the other ends of the plural conductive terminals 13. Hence, the electronic device can use the USB Type-C interface to perform a transmission of data and power through the connector module 1.

Please also refer to FIG. 3, which depicts a circuit connection diagram according to a first embodiment of the present invention. As shown in FIG. 3, in the first embodiment of the present invention, the connector module 1 is inserted in the mainboard through the conductive terminals 13 and electrically connected with a Platform Controller Hub (PCH) 2, a power control chip 22, and a system power 23 of the mainboard.

The USB Type-C connector 11 mainly has the golden-fingers 102 (i.e. 24 pieces), wherein at least two configuration channels (CC) golden-fingers are included. As shown in FIG. 3, in the present embodiment, two CC golden-fingers (CC1, CC2) of the USB Type-C connector are electrically connected with the CC chip 12 through the circuit board 10. Thereby, the CC chip 12 can determine whether USB Type-C signals or USB 2.0 signals of the USB Type-C connector will be outputted through the two CC golden-fingers.

Specifically, one part of the CC chip 12 is electrically connected with the two CC golden-fingers through the circuit board 10, and another part of the CC chip 12 is electrically connected to the PCH 2 of the main board through the conductive terminals 13.

As mentioned above, when the USB Type-C connector 11 is triggered by an external connector (not shown), the CC chip 12 will transmit a feedback signal of the two CC golden-fingers to the PCH 2. Thus the PCH 2 can determine whether or not the external connector supports the USB Type-C interface through the feedback signal. Moreover, the PCH 2 can send a control command to the CC chip 12 when the external connector supports the USB Type-C interface. Therefore, the CC chip 12 can control the USB Type-C connector and output USB Type-C signals according to the control command.

On the contrary, the PCH 2 can send another control command to the CC chip 12 when the external connector does not support the USB Type-C interface (i.e. the external connector is disposed in a transmission line, and another end of the transmission line is provided with a USB 2.0 connector, which only supports a USB 2.0 interface). Therefore, the CC chip 12 can control the USB Type-C connector 11 for outputting USB 2.0 signals according to the another control command. However, the above-mentioned is just one embodiment, included but not limited to, of the present invention.

It is worth of noticing that if the external connector can support the USB Type-C interface and one of the two CC golden-fingers is surely to be triggered by the external connector, the CC chip 12 can output a connection voltage (Vconn) to the other CC golden-finger of the USB Type-C connecot1 11 according to the control of the PCH 2.

Specifically, the CC chip 12 is electrically connected with the power control chip 22 and the PCH 2 of the mainboard through a first conductive terminal and a second conductive terminal of the conductive terminals 13. In the present embodiment, the CC chip 12 is an active IC, and the power control chip 22 provides power (Vcc) for an operation of the CC chip 12 through the first conductive terminal. Besides, the CC chip 12 electrically connects with the PCH 2 through the second conductive terminal and accepts the control of the PCH 2. The CC chip 12 receives the connection voltage provided by the power control chip 22 through the first conductive terminal and outputs to the USB Type-C connector 11 when the USB Type-C connector is needed. The effect of the connection voltage is common knowledge that will not be described herein.

The golden-fingers 102 of the USB Type-C connector 11 further include a plural of power golden-fingers. In the present embodiment, the plural power golden-fingers are electrically connected with the conductive terminals 13 through the circuit board 10 and received an output power of the system power 23. Thereby, the USB Type-C connector 11 can receive a needed working voltage (VBUS) through the power control chip 22 for an external output.

More specifically, the system power 23 of the mainboard has a 12V power output generally. The power control chip 22 receives a power output of the system power 23 and performs a pressure drop and then output based on a demand of the USB Type-C connector 11. For example, in the present embodiment, the connection voltage (Vconn) is 5V, and the working voltage (VBUS) is 5V.

The golden-fingers 102 of the USB Type-C connector 11 also include a plural of data golden-fingers. In the present embodiment, the data golden-fingers are electrically connected with the conductive terminals 13 through the circuit board 10 and electrically connected to the PCH 2 directly through the conductive terminals 13. Thereby, the mainboard can perform a data transmitting with an external part by the USB Type-C connector 11.

As shown in FIG. 3, in the present embodiment, the USB Type-C connector 11 transmits differential data signals (D+ and D−) corresponding to the USB 2.0 interface through the data golden-fingers and the PCH 2.

The USB Type-C connector 11 also transmits two sets of super speed transmitter differential pair (SSTx+, SSTx−), super speed receiver differential pair (SSRx+, SSRx−) corresponding to the USB 3.1 interface through the data golden-fingers and the PCH 2. It is worth mentioning that the PCH 2 of the present embodiment can directly support at least six chipsets of USB3.1 signal port for instance; therefore, the mainboard does not have to dispose a chip (usually a converter chip for converting PCI-E signals to a single set of USB3.1 signals) additionally for switching signals, and two sets of USB 3.1 interface signals can be provided directly to the connector module 1 for supporting the two sets of USB 3.1 signals (i.e. the Tx1, Rx1 (a first set of USB 3.1 signals) and Tx2, Rx2 (a second set of USB 3.1 signals) shown in FIG. 3) needed on an upper layer and a lower layer of the USB Type-C connector at the same time.

In addition, the USB Type-C connector 11 can also transmits differential signals of Lane 0 (Lane 0), differential signals of Lane 1 (Lane 1), differential signals of Lane 2 (Lane 2), differential signals of Lane 3 (Lane 3) and differential signals of auxiliary Lane (AUX) corresponding to the DisplayPort interface through the data golden-fingers and the PCH 2. As a result, the USB Type-C connector 11 can integrate the USB 2.0 signals, USB 3.1 signals and the DisplayPort signals provided by the PCH 2 to form USB Type-C signals. Therefore, the connector module 1 can perform a data transmitting with an external part through the USB type-C interface.

In the present embodiment, the USB type-C connector 11 and the CC chip 12 are disposed together in the connector module 1 for saving precious configuration space of the mainboard. Thereby, a circuit design of the mainboard could be simplified greatly for reducing manufacturing costs.

Figure 4:
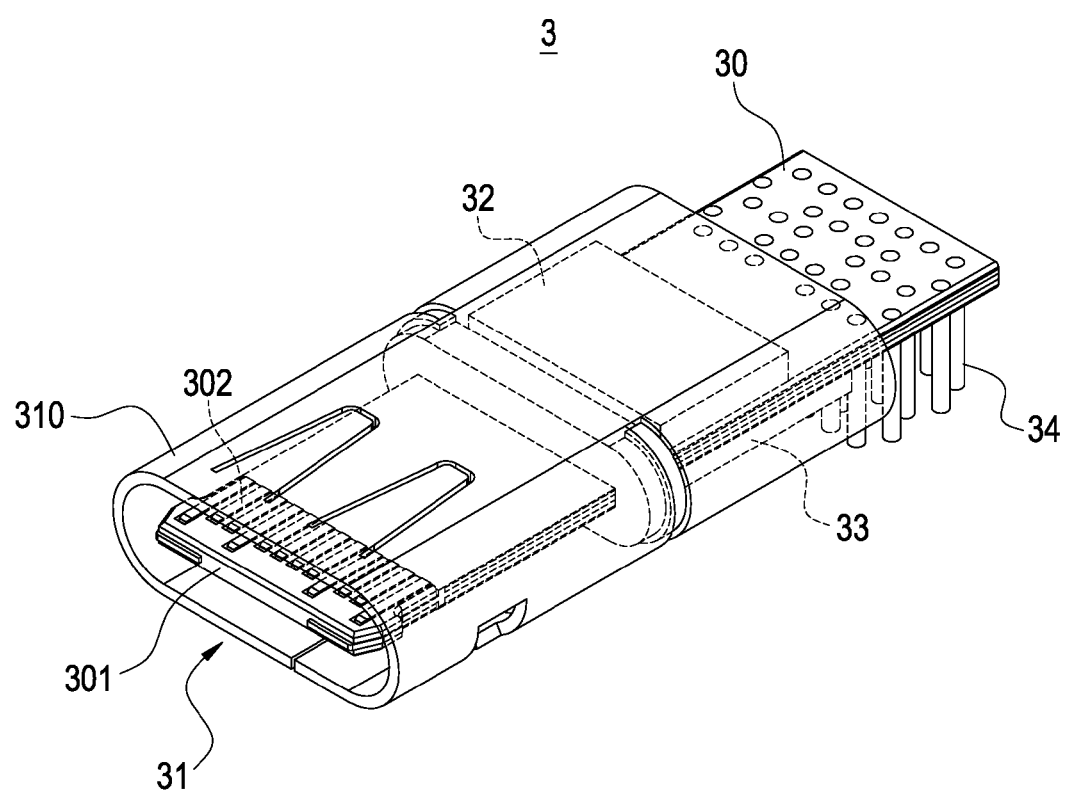
FIG. 4 is a perspective assembly view of a connector module according to a second embodiment of the present invention.

Please further refer to FIG. 4, which depicts a perspective assembly view according to a second embodiment of the present invention. The second embodiment of the present invention discloses another USB Type-C connector module (hereinafter briefly named the connector module 3) including a circuit board 30, a USB Type-C connector 31, a first chip 32, a second chip 33 and a plural of conductive terminals 34.

Specifically, one end of the circuit board 30 has a tongue 301, and a plurality of golden-fingers 301 are arranged at an upper and a lower sides of the tongue 301. A USB type-C interface is constituted by the tongue 301 and the golden-fingers together. Besides, the connector module 3 also has an iron shell 310 covering the tongue 301 and the golden-fingers 302. Thus, the tongue 301, the golden-fingers 302, and the iron shell 110 are configured to form the USB Type-C connector 31.

In the present embodiment, the circuit board 30, the USB Type-C connector 31, the golden-fingers 302, the first chip 32, and the conductive terminals 34 are substantially the same as the circuit board 10, the USB Type-C connector 11, the golden-fingers 102, the CC chip 12, and the conductive terminals 13, and that will not be described herein.

A difference between the connector module 3 of the present embodiment and the described connector module 1 is that the connector module 3 further includes the second chip 33 electrically connected to the circuit board 30. In the present embodiment, the first chip 30 is disposed on a side of the circuit board 30 and the second chip 33 is, preferably but not limited to, disposed in another side oppositely.

The second chip 32 is electrically connected with the USB Type-C connector 31 (that is elecytrically connected with the golden-fingers 302) through the circuit board 30, and the conductive terminals 34 are electrically connected with the USB Type-C connector 31, the first chip 32, and the second chip 33 through the circuit board 30 simultaneously.

Figure 5:
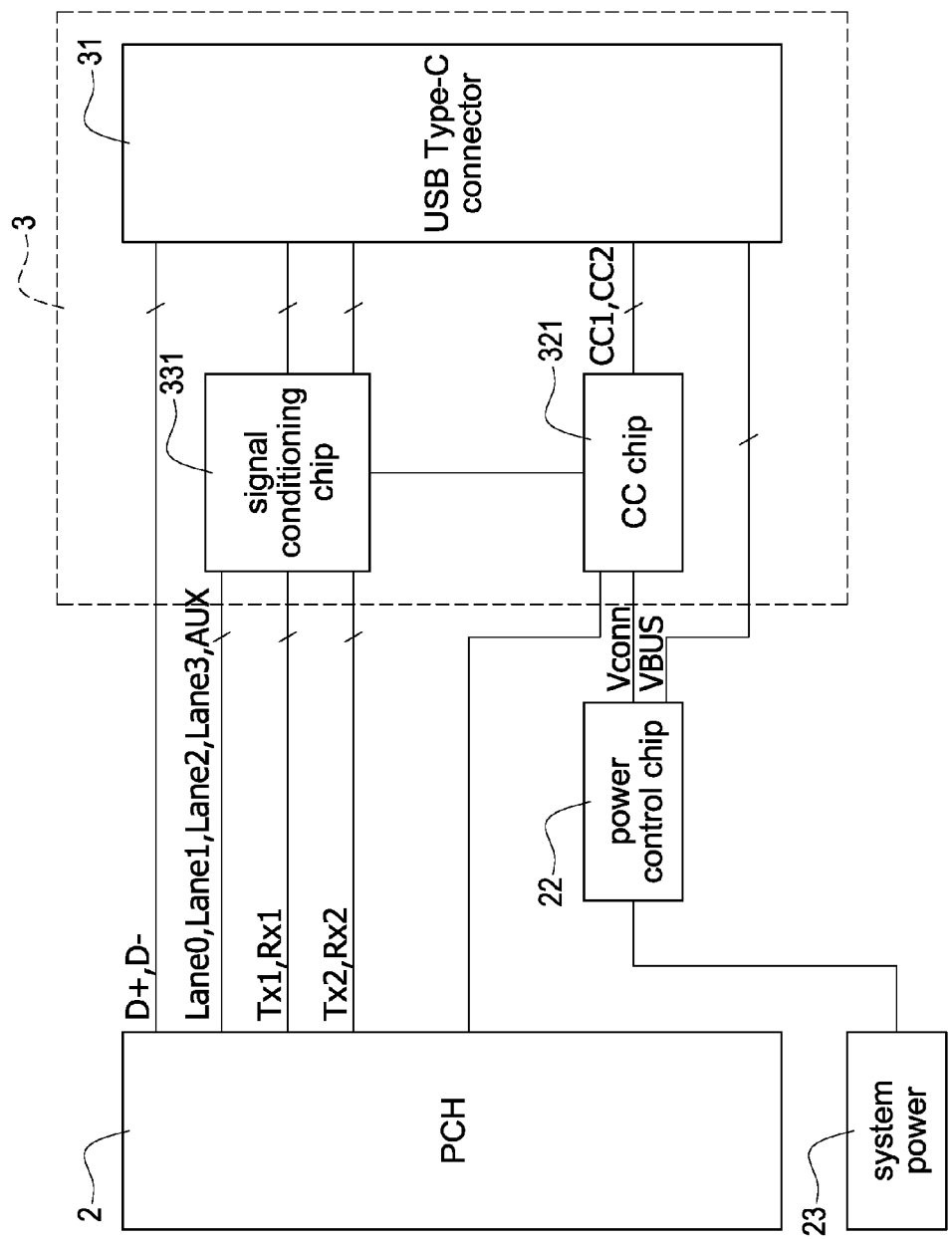
FIG. 5 is a circuit connection diagram according to a second embodiment of the present invention.

With referring to FIG. 5, it depicts a circuit connection diagram according to a second embodiment of the present invention. In the present embodiment, the first chip 32 is a CC chip 321 and electrically connected with two CC golden-fingers (CC1, CC2) of the USB Type-C connector 31. In the present embodiment, the CC chip 321, two CC golden-fingers of the USB Type-C connector 31, and the plural power golden-fingers are the same as those in the first embodiment, and that will not be described herein.

In the present embodiment, the plural golden-fingers 302 of the USB Type-C connector 31 include a plural of data golden-fingers, wherein the data golden-fingers includes a plurality of first data golden-fingers. The first data golden-fingers are electrically connected with the second chip 33 through the circuit board 30, and the second chip 33 are electrically connected to the PCH 2 of the mainboard of an external electronic device through the plural conductive terminals 34, wherein the plural first data golden-fingers include an upper layer golden-fingers and a lower layer golden-fingers of the USB Type-C connector 31. Therefore, as shown in FIG. 5, the first data golden-fingers are electrically connected with the second chip 33 mainly through two data transmission paths separately for receiving upper layer USB Type-C signals and lower layer USB Type-C signals outputted from the PCH 2 respectively.

Moreover, the data golden-fingers of the USB Type-C connector 31 also include a plural of second data golden-fingers. The second data golden-fingers are electrically connected with the conductive terminals 34 through the circuit board 30 and directly connected to the PCH 2 through the conductive terminals 34. Thus the second data golden-fingers and the PCH 2 transmit differential data signals (D+ and D−) corresponding to the USB 2.0 interface.

In particular, the second chip 33 of the present embodiment is a signal conditioning chip 331. The plural first data golden-fingers of the USB Type-C connector 31 are electrically connected with the signal conditioning chip 331 through the two data transmission paths separately. The signal conditioning chip 331 is electrically connected to the PCH 2 through the conductive terminals 34. Besides, the signal conditioning chip 331 and the PCH 2 transmit two set of super speed transmitter differential pair (SSTx+, SSTx−), super speed receiver differential pair (SSRx+, SSRx−) corresponding to the USB 3.1 interface, and differential signals of Lane 0 (Lane 0), differential signals of Lane 1 (Lane 1), differential signals of Lane 2 (Lane 2), differential signals of Lane 3 (Lane 3), and differential signals of auxiliary Lane (AUX) corresponding to the DisplayPort interface.

As mentioned above, thereby, the connector module 3 can amplify the DisplayPort signals and the USB 3.1 signals outputted from the PCH 2 through the signal conditioning chip 331 for solving a signal attenuation problem caused by a long distance. Similarly, the connector module 3 can amplify the received signals through the signal conditioning chip 331 and then output to the PCH 2. In the present embodiment, because the USB 2.0 signals outputted from the PCH 2 do not have a signal attenuation problem so that it does not need to be processed through the signal conditioning chip 331.

It is worth of noticing that the signal conditioning chip 331 is electrically connected with the CC chip 321 through the circuit board 30. Thus, a control of the CC chip 321 is accepted (the CC chip 321 is controlled by the PCH 2), and the CC chip 321 controls an operation of the signal conditioning chip 331 for amplifying output signals of the PCH 2/the USB Type-C connector 31 when needed.

In the present embodiment, the USB type-C connector 31, the CC chip 321, and the signal conditioning chip 331 are disposed in the connector module 3 together for saving precious configuration space of the mainboard, and a circuit design of the mainboard could be simplified greatly.

Figure 6:
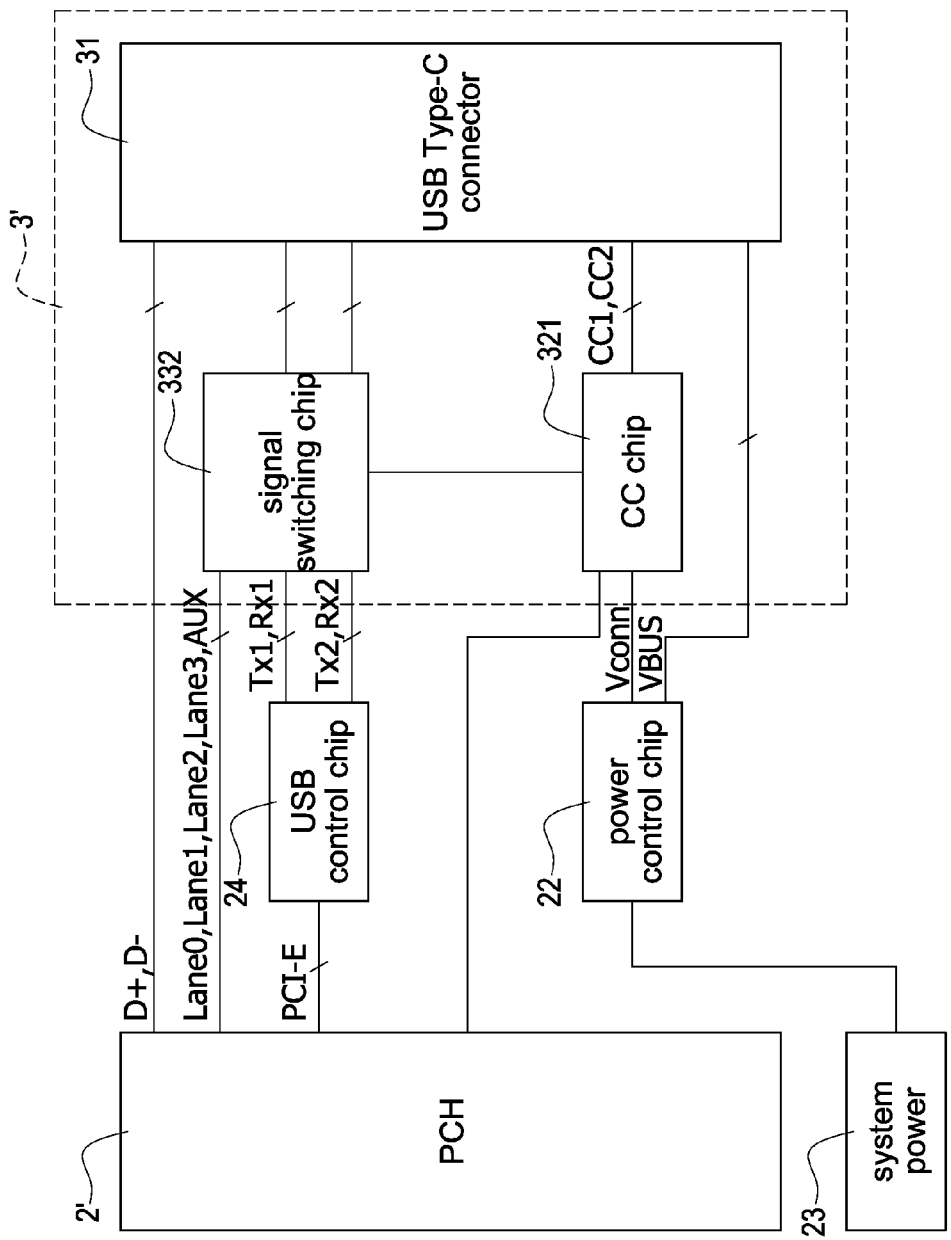
FIG. 6 is a circuit connection diagram according to a third embodiment of the present invention.

With referring to FIG. 6, it depicts a circuit connection diagram according to a third embodiment of the present invention. The third embodiment of the present invention discloses a further USB Type-C connector module (hereinafter briefly named the connector module 3') including the circuit board 30, the USB Type-C connector 31, the first chip 32, the second chip 33 and the plural conductive terminals 34 being the same as the connector module 3 of the second embodiment, and that will not be described again herein. A difference between the connector module 3' and the connector module 3 disclosed in FIG. 5 is that the second chip 33 of the connector module 3' is a signal switching chip 332.

More specifically, the connector module 3' is mainly used to connect with a mainboard (not shown in the figure) of another electronic device and electrically connected to a PCH 2', the power control chip 22, the system power 23, and a USB control chip 24 on the mainboard.

In the present embodiment, the PCH 2' can support a single set of USB 3.1 signal port only through a PCI-E interface. Hence the PCH 2' should act in concert with the USB control chip 24 to transverse the PCI-E signals of single port and simulate as USB 3.1 signals of multiple ports and then switch through the signal switching chip 332 for supporting two sets of USB 3.1 signals needed in an upper layer and a lower layer of the Type-C connector 31.

As shown in FIG. 6, in the present embodiment, the second data golden-fingers of the USB Type-C connector 31 are the same as those in the embodiment in FIG. 5; the second data golden-fingers are electrically connected with the conductive terminals 34 through the circuit board 30 and directly connected to the PCH 2' through the conductive terminals 34; thus differential data signals (D+ and D−) corresponding to the USB 2.0 interface are transmitted with the PCH 2'.

The plural first data golden-fingers of the USB Type-C connector 31 are electrically connected with the signal switching chip 332 through the data transmission paths separately, and partial pinouts of the signal switching chip 332 are electrically connected with the USB control chip 24 of the mainboard through the conductive terminals 34. Therefore, two sets of super speed transmitter differential pair (SSTx+, SSTx−), super speed receiver differential pair (SSRx+, SSRx−) corresponding to the USB 3.1 interface are transmitted with the PCH 2' through the signal switching chip 332 and the USB control chip 24, and that is the Tx1, Rx1 (first set of USB 3.1 signals), and Tx2, Rx2 (second set of USB 3.1 signals) shown in FIG. 6.

Besides, other pinouts of the signal switching chip 332 are directly electrically connected to the PCH 2' through the conductive terminals 34; differential signals of Lane 0 (Lane 0), differential signals of Lane 1 (Lane 1), differential signals of Lane 2 (Lane 2), differential signals of Lane 3 (Lane 3) and differential signals of auxiliary Lane (AUX) corresponding to the DisplayPort interface are transmitted with the PCH 2'.

It is worth noticing that one pinout of the signal switching chip 332 is electrically connected with the configuration channel through the circuit board 30. Thus, a control of the CC chip 321 is accepted (the CC chip 321 is controlled by the PCH 2'), and an operation of the signal switching chip 332 is controlled by the CC chip 321 for outputting a first set of USB 3.1 signals (Tx1, Rx1) and a second set of USB 3.1 signals (Tx2, Rx2) of the USB control chip 24 for switching (corresponding to upper layer signals and lower layer signals of the USB Type-C connector 31 separately) when needed.

More specifically, the PCH 2' receives feedback signals of the two CC golden-fingers (CC1, CC2) by the CC chip 321 and thereby determines whether twelve golden-fingers of an upper layer or twelve golden-fingers of a lower layer are triggered by the USB Type-C connector 31. Moreover, the PCH 2' sends a control signal to the CC chip 321 for controlling an operation of the signal switching chip 332 according to the determining result and then commands the signal switching chip 332 switching one of the two sets of USB 3.1 signals (through one of the two data transmission paths) and outputting to the USB Type-C connector 31.

In the present embodiment, the USB Type-C connector 31, the CC chip 321, and the signal switching chip 332 are disposed together in the connector module 3 for saving precious configuration space and simplifying a circuit design of the mainboard greatly.

Figure 7:
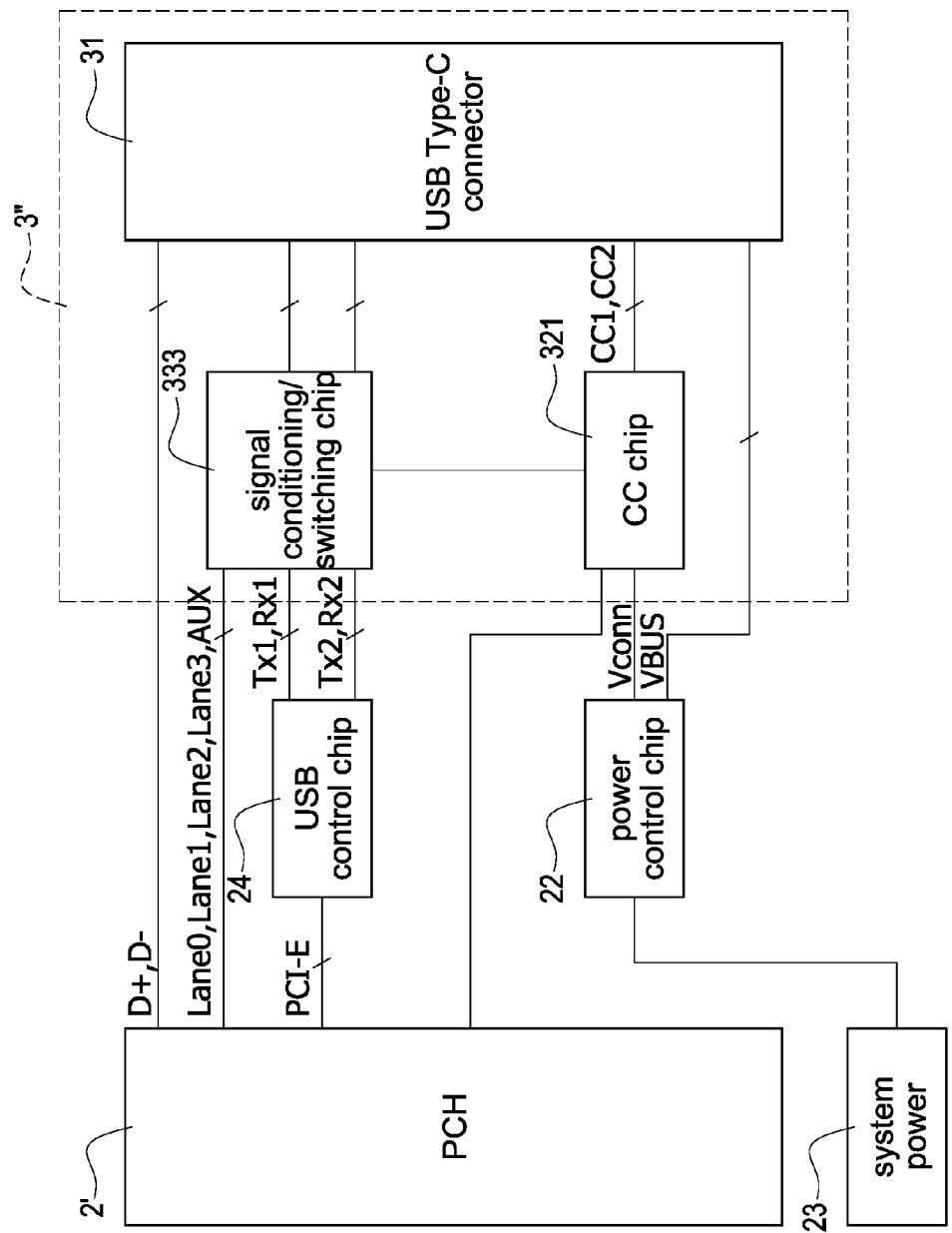
FIG. 7 is a circuit connection diagram according to a fourth embodiment of the present invention.

Please further refer to FIG. 7, which depicts a circuit connection diagram according to a fourth embodiment of the present invention. In FIG. 7, it discloses a further USB Type-C connector module (hereinafter briefly named the connector module 3"). A difference between the connector module 3" of the present embodiment and the described connector module 3, 3' is that the second chip 33 of the connector module 3" is a signal conditioning/switching chip 333 that has a signal conditioning function along with a signal switching function.

In the present embodiment, the second data golden-fingers of the USB Type-C connector 31 are the same as those of the embodiments in FIG. 5 and FIG. 6. The second data golden-fingers are electrically connected with the conductive terminals 34 through the circuit board 30 and directly connected to the PCH 2' through the conductive terminals 34, thus differential data signals (D+ and D−) corresponding to the USB 2.0 interface are transmitted with the PCH 2'.

The first data golden-fingers of the USB Type-C connector 31 are electrically connected with the signal conditioning/switching chip 333 through the circuit board 30. More specifically, the first data golden-fingers includes plural upper layer golden-fingers and plural lower layer golden-fingers which are connected with the signal conditioning/switching chip 333 through the two data transmission paths.

Partial pinouts of the signal conditioning/switching chip 333 are directly electrically connected to the PCH 2' of the mainboard through the conductive terminals 34; differential signals of Lane 0 (Lane 0), differential signals of Lane 1 (Lane 1), differential signals of Lane 2 (Lane 2), differential signals of Lane 3 (Lane 3) and differential signals of auxiliary Lane (AUX) corresponding to the DisplayPort interface are transmitted with the PCH 2'.

Besides, other pinouts of the signal conditioning/switching chip 333 are connected to the USB control chip 24 of the mainboard through the conductive terminals 34. Therefore, two sets of super speed transmitter differential pair (SSTx+, SSTx−), super speed receiver differential pair (SSRx+, SSRx−) corresponding to the USB 3.1 interface are transmitted with the PCH 2' through the signal conditioning/switching chip 333 and the USB control chip 24, and that is the Tx1, Rx1 (first set of USB 3.1 signals), and Tx2, Rx2 (second set of USB 3.1 signals) shown in FIG. 7.

It is worth noticing that one pinout of the signal conditioning/switching chip 333 is electrically connected with the CC chip 321 through the circuit board 30. Thus, a control of the CC chip 321 is accepted (the CC chip 321 is controlled by the PCH 2'), and an operation of the signal conditioning/switching chip 333 is controlled by the CC chip 321 for outputting a first set of USB 3.1 signals (Tx1, Rx1) and a second set of USB 3.1 signals (Tx2, Rx2) of the USB control chip 24 for switching and amplifying output signals of the PCH 2'/the USB Type-C connector 31. In other words, the signal conditioning/switching chip 333 of the present embodiment in an integration of the signal conditioning chip 331 and the signal switching chip 332, and that can be implemented in the PCH 2' for supporting single set of USB 3.1 signals only through the PCI-E interface.

In the present embodiment, the USB type-C connector 31, the CC chip 321, and the signal conditioning/switching chip 333 having a signal conditioning function along with a signal switching function are disposed in the connector module 3 together for saving precious configuration space on the mainboard thereby, and a circuit design of the mainboard could be simplified greatly.

In the above embodiments, the circuit board, USB Type-C connector, chips and conductive terminals are all disposed in a single connector module. As shown in FIG. 1, 2 and FIG. 4, the lengths of those connector modules 1, 3 are longer than those of standard USB Type-C connectors. Furthermore, the connector modules 1, 3 mainly dispose all the conductive terminals 13, 34 in rear ends of the whole connector modules 1, 3. Therefore, if the connector modules 1, 3 of the present invention are disposed in a mainboard, those existing holes of the USB Type-C connector on the mainboard cannot be adapted and need to be redesigned.

Figure 8:
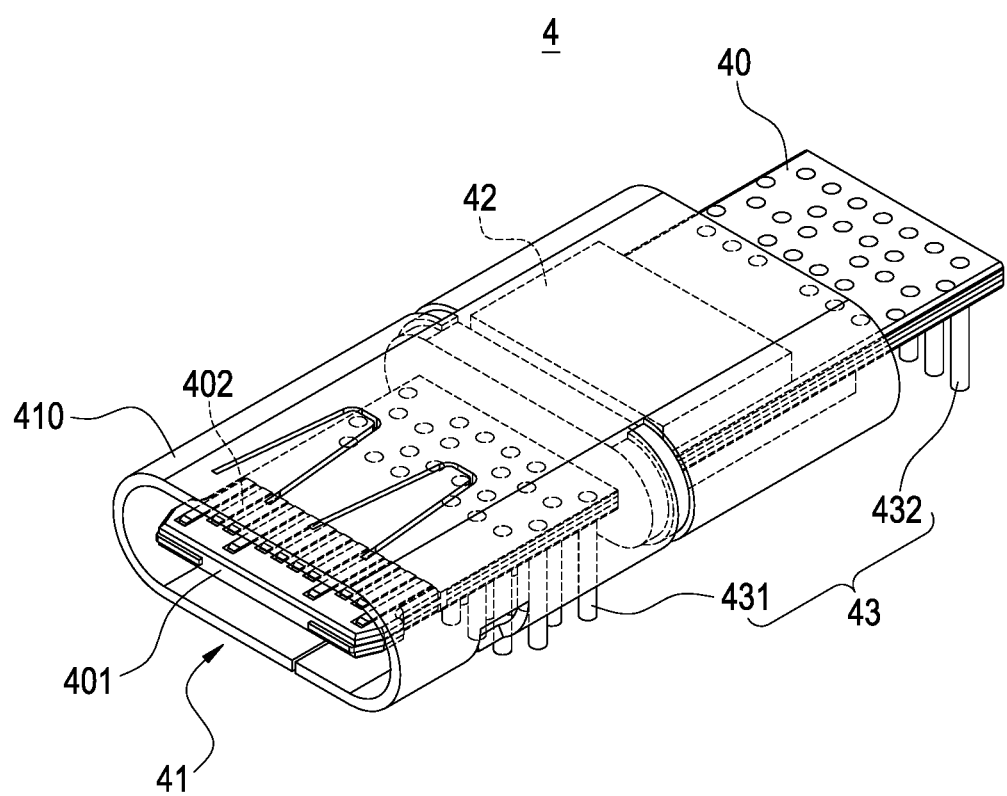
FIG. 8 is a perspective assembly view according to a connector module of a fifth embodiment of the present invention.

With referring to FIG. 8, it depicts a perspective assembly view of a connector module according to a fifth embodiment of the present invention. In FIG. 8, another USB Type-C connector (hereinafter briefly named the connector module 4) is disclosed. The connector module 4 includes a circuit board 40, a USB Type-C connector 41, a first chip 42, and a plural of conductive terminals 43, wherein the USB Type-C connector 41 are constituted by a tongue 401 formed in a side of the circuit board 40, plural golden-fingers 402 arranged at two sides of the tongue 401, and an iron shell 410. The circuit board 40, the USB Type-C connector 41, and the first chip 42 are the same as the circuit board 10, the USB Type-C connector 11, and the CC chip 12, and that will not be described again herein.

As mentioned above, a difference between the connector module 4 of the present embodiment and the connector module 1 disclosed in FIG. 1 is that the conductive terminals 43 of the connector module 4 are composed of plural leading-edge conductive terminals 431 and trailing-edge conductive terminals 432.

Specifically, a quantity of the leading-edge conductive terminals is 24, and the leading-edge conductive terminals are arranged in a location close to the leading edge of the circuit board 40. Preferably, the leading-edge conductive terminals 431 are arranged close to the tongue 401 and, not limited to, between the tongue 401 and the first chip 42. It is worth noticing that the first chip 42 can be the prescribed CC chip 12, 321. Besides, the connector module 4 can also include the aforementioned second chip 33, such as the signal conditioning chip 331, the signal switching chip 332 or the signal conditioning/switching chip 333 etc. In the embodiment, the leading-edge conductive terminals 431 are arranged among the tongue 401, the first chip 42 and the second chip 33.

A quantity of the trailing-edge conductive terminal 432 is one or at least one, and the trailing-edge conductive terminal(s) 432 is/are disposed in a location close to the trailing edge of the circuit board 40. Preferably, the trailing-edge conductive terminal(s) 432 is disposed at another end of the circuit board 40 away from the tongue 401.

A main feature of this embodiment is that the USB Type-C connector 41 are constituted by the tongue 401, the golden-fingers 402, the leading-edge conductive terminals 431, and the iron shell 410. Besides, the dimensions and the specifications of the USB Type-C connector 41 are the same as those of standard USB Type-C connectors (not shown in the figures). As a result, when the connector module 4 is disposed on the mainboard, the existing holes of the USB Type-C connector on the mainboard can be adapted directly to connect with the leading-edge conductive terminals 431 of the connector module 4. Besides, the mainboard manufacturer can providing another one or plural holes corresponding to the trailing-edge conductive terminals 432 in a rear of the existing holes for connecting the connector module 4 by doing a slight post-production process of the mainboard. Therefore, the manufacturing of the mainboard will be easier.

In summary, the supporting spacer of the present invention can achieve the expected objective and overcome the disadvantages of the prior art. Also it is indeed novel, useful, and non-obvious to be patentable. Please examine the application carefully and grant it as a formal patent for protecting the rights of the inventor.

What is claimed is:

1. A USB Type-C connector module disposed on an external mainboard, comprising:
    a circuit board having a tongue extended in one end, a plurality of golden-fingers arranged at an upper and a lower sides of the tongue, where in the golden-fingers at least including two configuration channel golden-fingers, a plurality of power golden-fingers and a plurality of data golden-fingers;
    an iron shell covering the tongue and the golden-fingers and being together with the tongue and the golden-fingers to form a USB Type-C connector;
    a configuration channel chip electrically connected with the circuit board; and
    a plural of conductive terminals electrically connected with the circuit board, and the conductive terminals being electrically connected with the USB Type-C connector and the configuration channel chip through the circuit board;
    wherein, the two configuration channel golden-fingers are electrically connected with the configuration channel chip through the circuit board, and the power golden-fingers are electrically connected with a power control chip of the external mainboard through the conductive terminals; the data golden-fingers are electrically connected with a Platform Controller Hub of the external mainboard through the conductive terminals; the configuration channel chip is electrically connected with the Platform Controller Hub through the conductive terminals and transmits feedback signals of the two configuration channel golden-fingers to the Platform Controller Hub for detecting a USB type-C interface.

2. The USB Type-C connector module according to claim 1, wherein the configuration channel chip is further connected to the power control chip through the conductive terminals; the power control chip receives a connection voltage (Vconn) and outputs to one of the two configuration channel golden-fingers.

3. The USB Type-C connector module according to claim 2, wherein the USB Type-C connector transmits differential data signals (D+ and D−) corresponding to a USB 2.0 interface, two sets of super speed transmitter differential pair (SSTx+, SSTx−), super speed receiver differential pair (SSRx+, SSRx−) corresponding to a USB 3.1 interface, and differential signals of Lane 0 (Lane 0), differential signals of Lane 1 (Lane 1), differential signals of Lane 2 (Lane 2), differential signals of Lane 3 (Lane 3) and differential signals of auxiliary Lane (AUX) corresponding to a DisplayPort interface through the data golden-fingers and the Platform Controller Hub.

4. The USB Type-C connector module according to claim 1, wherein the conductive terminals include a plurality of leading-edge conductive terminals and at least one trailing-edge conductive terminal; a quantity of leading-edge conductive terminals is 24, and the leading-edge conductive terminals are arranged between the tongue and the configuration channel chip; the trailing-edge conductive terminal(s) is/are disposed on the circuit board at another end away from the tongue.

5. A USB Type-C connector module disposed on an external mainboard, comprising:
   a circuit board having a tongue extended in an end, a plurality of golden-fingers arranged at an upper and a lower sides of the tongue, where in the golden-fingers at least including two configuration channel golden-fingers, a plurality of power golden-fingers, a plurality of first data golden-fingers, and a plurality of second data golden-fingers;
   an iron shell covering the tongue and the golden-fingers and being together with the tongue and the golden-fingers to form a USB Type-C connector;
   a first chip electrically connected with the circuit board and being electrically connected with the USB Type-C connector through the circuit board, wherein the first chip is a configuration channel chip;
   a second chip electrically connected with the circuit board and being electrically connected with the USB Type-C connector through the circuit board; and
   a plurality of conductive terminals electrically connected with the circuit board and being electrically connected with the USB Type-C connector, the first chip and the second chip through the circuit board;
   wherein the two configuration channel golden-fingers are electrically connected with the first chip, and the power golden-fingers are electrically connected with a power control chip of the external mainboard through the conductive terminals; the first data golden-fingers are electrically connected with the second chip through two data transmission paths separately; the second data golden-fingers are electrically connected with a Platform Controller Hub of the external mainboard through the conductive terminals separately, and the second chip is electrically connected with the Platform Controller Hub through the conductive terminals;
   wherein, the first chip is electrically connected the Platform Controller Hub through the conductive terminals and transmits feedback signals of the two configuration channel golden-fingers to the Platform Controller Hub for detecting a USB type-C interface.

6. The USB Type-C connector module according to claim 5, wherein the first chip is further connected to the power control chip through the conductive terminals; the power control chip receives a connection voltage (Vconn) and outputs to one of the two configuration channel golden-fingers.

7. The USB Type-C connector module according to claim 6, wherein the first chip is electrically connected with the second chip through the circuit board and controls an operation of the second chip according to a detecting of the Platform Controller Hub.

8. The USB Type-C connector module according to claim 7, wherein the second chip is a signal conditioning chip connected with the Platform Controller Hub through the conductive terminals, the first data golden-fingers transmit two sets of super speed transmitter differential pair (SSTx+, SSTx−), super speed receiver differential pair (SSRx+, SSRx−) corresponding to a USB 3.1 interface through the signal conditioning chip and the Platform Controller Hub, and differential signals of Lane 0 (Lane 0), differential signals of Lane 1 (Lane 1), differential signals of Lane 2 (Lane 2), differential signals of Lane 3 (Lane 3) and differential signals of auxiliary Lane (AUX) corresponding to a DisplayPort interface; the second data golden-fingers transmit differential data signals (D+ and D−) corresponding to a USB 2.0 interface directly through the conductive terminals and the Platform Controller Hub.

9. The USB Type-C connector module according to claim 7, wherein the second chip is a signal switching chip which has partial pinouts connecting with a USB control chip of the mainboard through the conductive terminals, wherein the first data golden-fingers and the Platform Controller Hub transmit two sets of super speed transmitter differential pair (SSTx+, SSTx−), super speed receiver differential pair (SSRx+, SSRx−) corresponding to a USB 3.1 interface through the signal switching chip and a USB control chip; other pinouts of the second chip are electrically connected with the Platform Controller Hub through the conductive terminals and directly transmit differential signals of Lane 0 (Lane 0), differential signals of Lane 1 (Lane 1), differential signals of Lane 2 (Lane 2), differential signals of Lane 3 (Lane 3) and differential signals of auxiliary Lane (AUX) corresponding a DisplayPort interface with the Platform Controller Hub; the second data golden-fingers directly transmit differential data signals (D+ and D−) corresponding to a USB 2.0 interface through the conductive terminals and the Platform Controller Hub.

10. The USB Type-C connector module according to claim 9, wherein the second chip is a signal conditioning/switching chip having a signal conditioning function along with a signal switching function.

11. The USB Type-C connector module according to claim 5, wherein the first chip is disposed in a side of the circuit board, and the second chip is disposed in another side of the circuit board relative to the first chip.

12. The USB Type-C connector module according to claim 5, wherein the conductive terminals includes a plurality of leading-edge conductive terminals and at least one trailing-edge conductive terminals; a quantity of leading-edge conductive terminals is 24, and the leading-edge conductive terminals are disposed between the tongue and the configuration channel chip; the trailing-edge conductive terminal(s) is/are disposed at another end of the circuit board away from the tongue.

* * * * *